US006573746B2

(12) United States Patent
Kim et al.

(10) Patent No.: US 6,573,746 B2
(45) Date of Patent: Jun. 3, 2003

(54) IMPEDANCE CONTROL CIRCUIT

(75) Inventors: Nam-Seog Kim, Seoul (KR); Uk-Rae Cho, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/872,894

(22) Filed: Jun. 1, 2001

(65) Prior Publication Data

US 2002/0063575 A1 May 30, 2002

(30) Foreign Application Priority Data

Nov. 30, 2000 (KR) ........................................ 2000-71832

(51) Int. Cl.[7] .............................................. H03K 19/003

(52) U.S. Cl. ............................ 326/30; 326/27; 326/82; 326/86; 326/21

(58) Field of Search ............................ 326/27, 30, 82, 326/86, 21; 329/108

(56) References Cited

U.S. PATENT DOCUMENTS 4,493,092 A * 1/1985 Adams ........................ 326/62
5,585,741 A * 12/1996 Jordan ......................... 326/30
6,288,564 B1 * 9/2001 Hedberg ....................... 326/21
6,307,791 B1 * 10/2001 Otsuka et al. ................ 326/30
6,333,623 B1 * 12/2001 Heisley et al. .............. 323/224

* cited by examiner

*Primary Examiner*—Michael G. Lee
*Assistant Examiner*—Steven S. Paik
(74) *Attorney, Agent, or Firm*—F. Chau & Associates, LLP

(57) ABSTRACT

An impedance control circuit that reduces the impedance variance when an external impedance generated from an external resistor is matched to internal impedance. In one aspect, an impedance control circuit comprises an external resistor for establishing a first reference voltage; a comparator for comparing the first reference voltage with a second reference voltage and outputting an impedance corresponding to the result of the comparison; and a PMOS current source connected to a constant-voltage source and to the output of the comparator, wherein the PMOS current source generates a current that corresponds to the impedance of the comparator.

18 Claims, 8 Drawing Sheets

IMPEDANCE CONTROL CIRCUIT

BACKGROUND

1. Technical Field

The present invention relates generally to an impedance control circuit and, more particularly, to an impedance control circuit that reduces the variance of an external impedance that is generated from an external resistor to match to an internal impedance.

2. Description of Related Art

Recently, the use of various "on-chip" termination techniques have be employed for high-speed data transmission in digital circuit designs. In one method, an on-chip parallel termination is utilized together with series termination. An advantage of parallel termination is that good signal integrity is maintained, although the swing level of the signal may be lowered due to minor dc power dissipation in the termination resistor. An advantage of series termination is that the termination resistor consumes less power than all other resistive termination techniques. When data is transmitted through a transmission line, if an output driver (Dout) and a receiver respectively operate as a source termination and parallel termination respectively, data is sent at a reduced swing level, but at the full swing of a signal.

It is preferable that the output driver and on-chip termination comprise a resistor. But since the output driver and on-chip driver are located in the chip, it is difficult to perform termination if a characteristic impedance of the transmission line lies in another environment. Thus, it is preferable to construct a circuit in which a desired impedance value can be programmable and set to the characteristic impedance of the transmission line.

In this regard, a programmable impedance control circuit may be employed for sensing the characteristic impedance of the transmission line and transmitting control signals indicative of the sensed impedance to adjust the impedance of the output driver and on-chip termination. The programmable impedance control circuit operates to substantially match the impedance to the value of a resistor that the user connects externally. Furthermore, the programmable impedance control circuit operates to match an internal impedance to an external impedance by actively updating digital codes based on changes in voltage and temperature (referred to as "VT change").

One method that is used to construct the aforementioned programmable impedance control circuit is for a user to connect a resistor to one side of a chip, wherein the resistor has an impedance value that is substantially identical to the external impedance. If the external resistor is connected to ground outside, the relevant impedance may be generated at the top portion of the chip. If the impedance is generated using a digital code method, the impedance may have a quantization error. When the impedance having a quantization error is matched to the impedance of a down driver, a quantization error occurring at the down driver makes the variance of the impedance of the down driver even greater in addition to the quantization error at the top of the chip.

The above-described problems associated with conventional impedance control circuits will be explained with reference to FIG. 1, which illustrates a structure of a conventional impedance control circuit. To generate an impedance that is substantially identical to an external resistor RQ, a method is used to sense when the external impedance becomes identical to an internal impedance by comparing a reference voltage equal to ½ of the voltage VDDQ (where VDDQ indicates high-speed transceiver logic voltage) with, e.g., a pad voltage that is established by RQ and a MOS Array 1. The impedance control circuit shown in FIG. 1 receives information regarding the impedance of the external resistor RQ. In the circuit, an internal impedance is using digital codes to change the impedance of the MOS array 1 by changing the number of enabled transistors that form the MOS array 1. Errors may be introduced by this circuit because these transistors of the MOS array operated in a linear region and are, thus, sensitive to VDDQ noise. Furthermore, the use of digital codes can result in a quantization error. A sensed impedance value having such errors is used to generate the impedance of a down driver, thereby making the variance even greater.

FIG. 2 illustrates another conventional impedance control circuit as disclosed in U.S. Pat. No. 5,606,275, entitled "Buffer Circuit Having Variable Output Impedance." With this circuit, the impedance is separately generated by an up driver and down driver. The output buffer circuit 20 has an output impedance that is adjusted based on the resistance of an external resistor 32. An NMOS transistor is used as a current source to provide resistant to VDD noise, and the bulk voltage is set at ground potential to place the operational region of a transistor into a saturation region. However, when the high-speed data transmission and high-integration of the chip reduces voltage of the chip, it is difficult to turn the operational region of the transistor into the saturation region with the bulk voltage of the NMOS transistor set at ground because the saturation region is so small. Furthermore, the circuit implements a complex process. Indeed, after the current source generates a current value that corresponds to the external resistor, the impedance of the down-driver is generated based on the generated current value and the current is duplicated to generate the impedance of the up-driver. Consequently, this process is complicated that it can be subject to errors that result in variance in the impedance.

SUMMARY OF THE INVENTION

It is an object of the present invention to provide an impedance control circuit that reduces errors in generating an internal impedance relating to an external resistance.

It is another object of the present invention to provide an impedance control circuit that can reduce error and effectively respond thereto even when the voltage of a chip decreases due to high-speed data transmission.

In one aspect of the present invention, an impedance control circuit comprises: an external resistor for establishing a first reference voltage; a comparator for comparing the first reference voltage with a second reference voltage and outputting an impedance corresponding to the result of the comparison; and a PMOS current source connected to a constant-voltage source and to the output of the comparator, wherein the PMOS current source generates a current that corresponds to the impedance.

In another aspect, the impedance control circuit further comprises a current mirror to duplicate the current of PMOS current source and transmit the current to an up and down driver. In one embodiment, the current mirror of the impedance control circuit is constructed using a PMOS and NMOS transistor.

In yet another aspect of the present invention, the impedance control circuit comprises: a pull-down circuit for receiving the current generated by the PMOS transistor of the current mirror and digitally coding the current relevant to the impedance; and a pull-up circuit for receiving the current generated by the NMOS transistor of the current mirror and digitally coding the current relevant to the impedance.

In one embodiment, the pull-down circuit comprises a second PMOS current source, connected to a constant-voltage source, for receiving current from the PMOS transistor of the current mirror; an NMOS detector connected to ground and to the second PMOS current source; a second comparator for comparing a third reference voltage with a fourth reference voltage established by the combination of the second PMOS current source and the NMOS detector and outputting an impedance corresponding to the comparison; and a first encoder for digitally coding the impedance output from the second comparator and outputting an impedance code to the down-driver. In addition, the pull-up circuit comprises: a NMOS current source, connected to ground, for receiving current from the NMOS transistor of the current mirror; a PMOS detector connected to a constant-voltage source and to the NMOS current source; a third comparator for comparing the third reference voltage with a fifth reference voltage established by the combination of the NMOS current source and the PMOS detector; and a second encoder for digitally coding the impedance output from the third comparator and outputting an impedance code to the up-driver.

These and other aspects, features and advantages of the present invention will be described and become apparent from the following detailed description of preferred embodiments, which is to be read in connection with the accompanying drawings.

DETAILED DESCRIPTION OF PREFERRED EMBODIMENTS

In the following description, the same or similar labels are used to denote elements or portions of elements having similar functionality. Further, a detailed description of well-known functions and structure that is not necessary for one skilled in the art to appreciate the present invention has been omitted.

Figure 1:
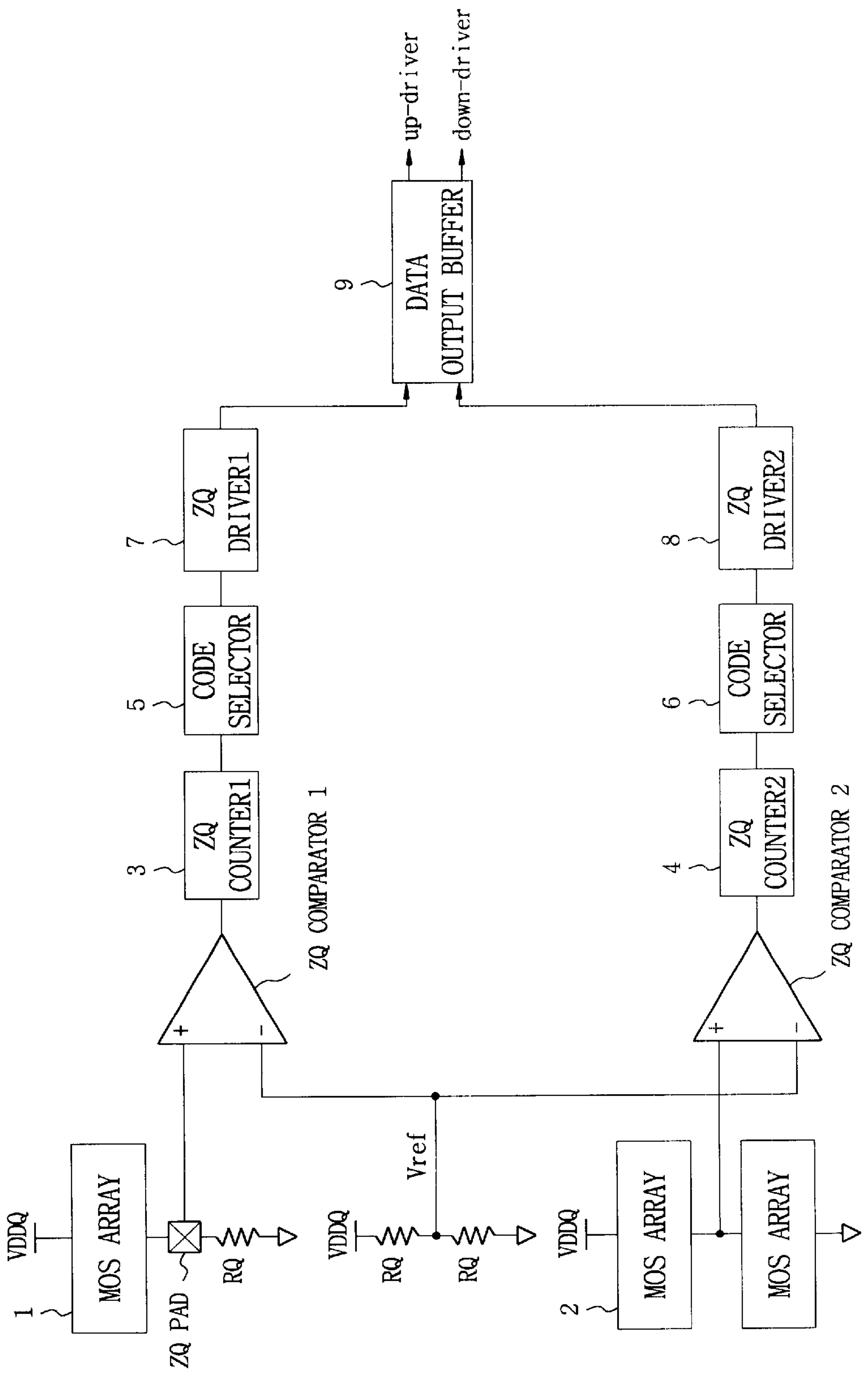
FIG. 1(PRIOR ART)
FIG. 1 is a diagram of a conventional impedance control circuit.
Figure 2:
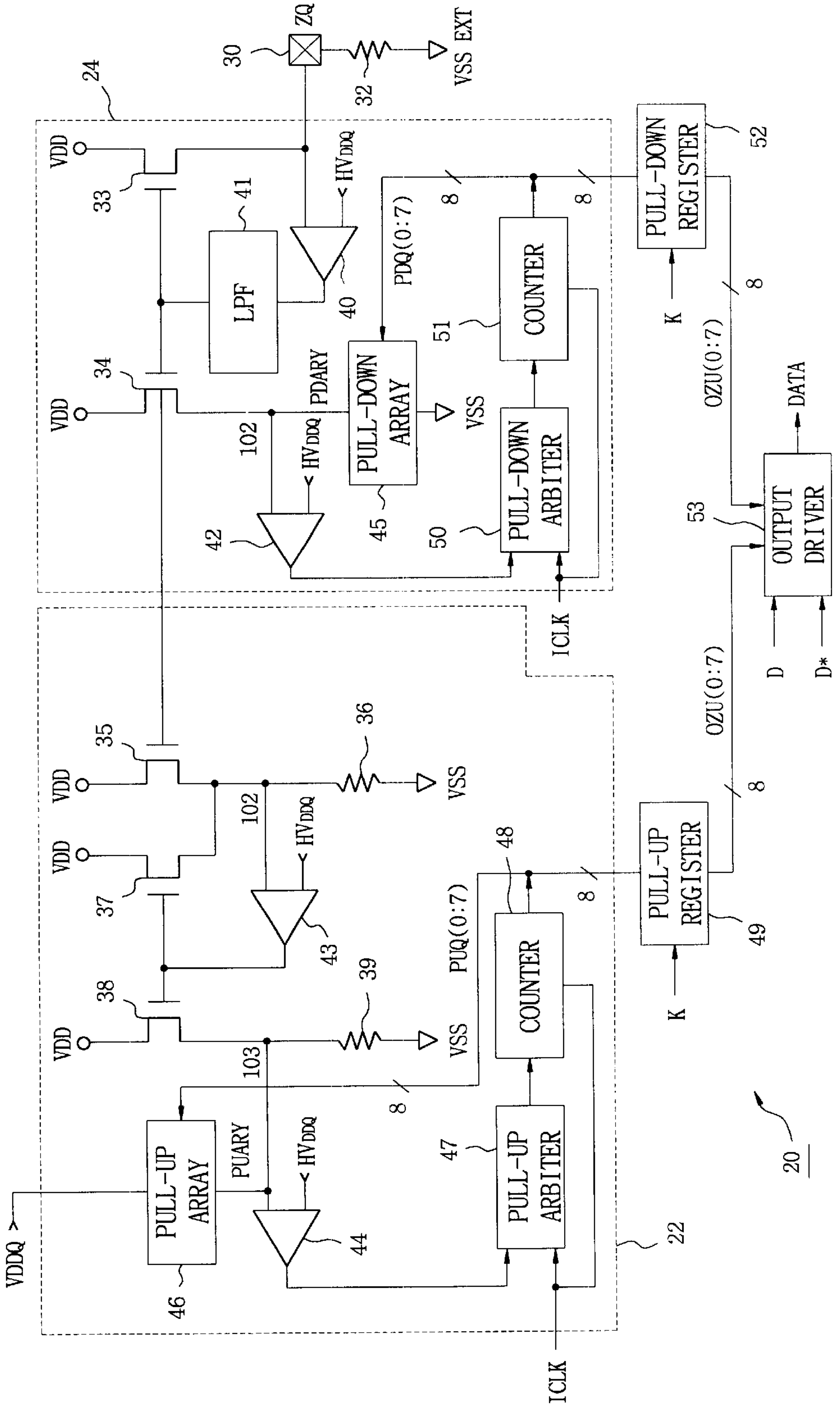
FIG. 2(PRIOR ART)
FIG. 2 is diagram of conventional impedance control circuit.
Figure 3:
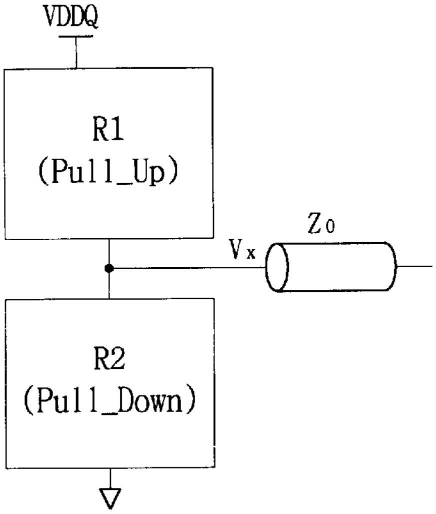
FIG. 3 illustrates a basic structure of an impedance control circuit.

FIG. 3 illustrates the basic structure of an impedance control circuit. Assuming a component constructed with a pull-up portion R1 and a pull-down portion R2 comprises an output driver, R1 and R2 preferably have a value equal to the characteristic impedance Zo of the transmission line at Vx=½VDDQ. When the component comprises a termination circuit, the value of R1 and R2 preferably have a value substantially equal to several values of the Vx, but do not have to be identical to the characteristic impedance of the transmission line. Likewise, the R1 and R2 for termination circuits used as output drivers should have substantially the same value. One method to accomplish this is to use identical references for the up and down drivers. However, it is not effective to use two pins of a chip for reference voltages when the number of pins is not sufficient. In other words, a circuit should be constructed to enable up and down drivers to have substantially the same impedance value to the reference resistance of either an up or down driver.

Figure 4:
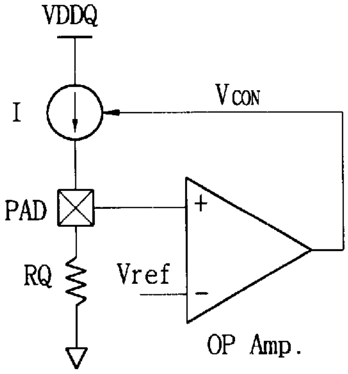
FIG. 4 is a circuit diagram illustrating the implementation of a current source in an impedance control circuit according to an embodiment of the present invention.
Figure 5A:
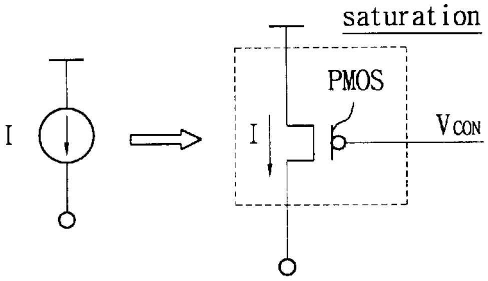
FIG. 5*a* is diagram of a current source that is utilized in the impedance control circuit of FIG. 4, according to an embodiment of the present invention.
Figure 5B:
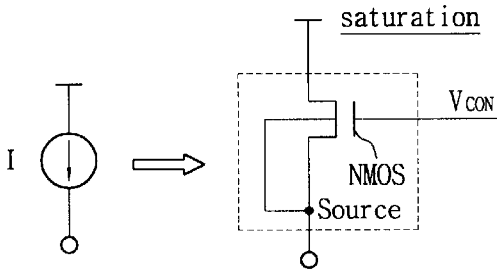
FIG. 5*b* is a diagram of a current source that is utilized in the impedance control circuit of FIG. 4, according to another embodiment of the present invention.
Figure 5C:
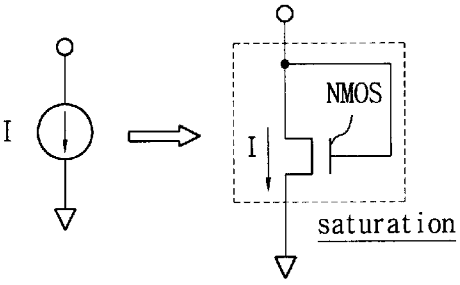
FIG. 5*c* is a diagram of a current source that is utilized in the impedance control circuit of FIG. 4, according to yet another embodiment of the present invention.

FIG. 4 is a circuit diagram illustrating the implementation of a current source in an impedance control circuit according to an embodiment of the present invention. In particular, the circuit comprises an external resistor RQ connected between ground and a pin of chip. In other words, the reference resistor RQ is connected between ground of a PCB (printed circuit board) and the pin of chip. To establish a voltage between PAD and ground having a value of predetermined internal reference voltage Vref, a comparator (OP Amp) compares the internal reference voltage Vref with the voltage across resistor RQ to generate a corresponding control voltage Vcon, which is input to the current source I to generate a relevant current. As shown in FIG. 5*a*, the current source I can be obtained by using a PMOS that operates in saturation. Alternatively, as shown in FIG. 5*b*, the current source I can be obtained by using an NMOS operating in saturation. The current source I comprising the NMOS in saturation area can be made by connecting bulk and source. Also, if current is transmitted by connecting the gate and drain of an NMOS, as shown in FIG. 5*c*, the NMOS can provide an efficient current source. Thus, two current sources that are used for reference are preferably generated to make values for the up and down impedance substantially the same.

Figure 6:
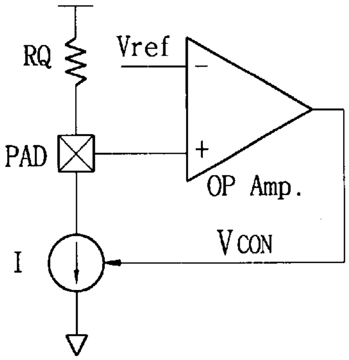
FIG. 6 is a circuit diagram illustrating the implementation of a current source in an impedance control circuit according to another embodiment of the present invention.
Figure 7A:
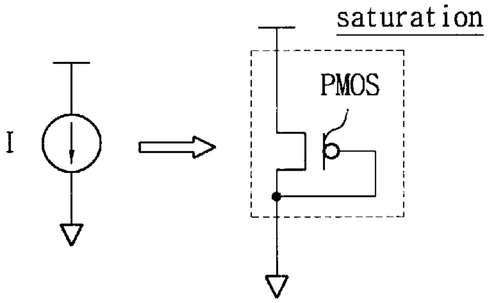
FIG. 7*a* is a diagram of a current source that is utilized in the impedance control circuit of FIG. 6, according to an embodiment of the present invention.
Figure 7B:
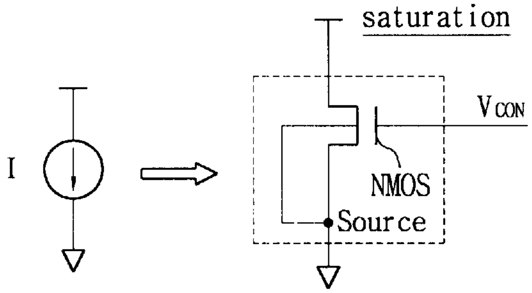
FIG. 7*b* is a diagram of a current source that is utilized in the impedance control circuit of FIG. 6, according to another embodiment of the present invention.
Figure 7C:
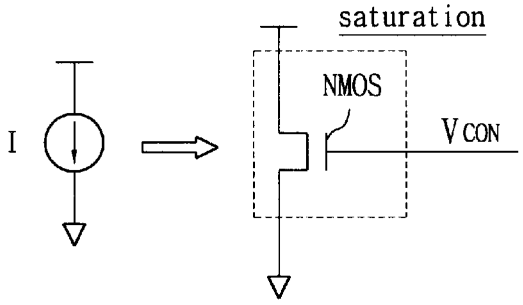
FIG. 7*c* is a diagram of a current source that is utilized in the impedance control circuit of FIG. 6, according to yet another embodiment of the present invention.

FIG. 6 illustrates a circuit wherein an external resistor RQ is connected between a VDDQ power source of a PCB and a pin of chip. FIG. 7*a* is an operational diagram where a PMOS is utilized as a current source I for the impedance control circuit shown in FIG. 6. FIG. 7*b* is an operational diagram where a NMOS having a connected source and bulk is utilized as a current source I of the impedance control circuit of FIG. 6. FIG. 7*c* is an operational diagram in which a NMOS is utilized as a current source I of the impedance control circuit of FIG. 6.

Figure 8:
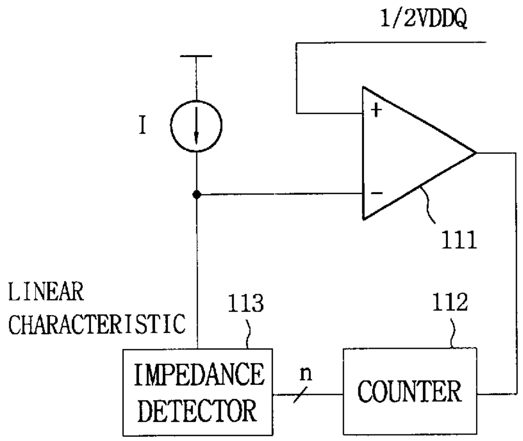
FIG. 8 is a high-level diagram of a circuit for generating an up-driver impedance code according to an embodiment of the present invention.

FIG. 8 is a high-level diagram of a circuit to generate an up-driver impedance code according to an embodiment of the present invention. More specifically, FIG. 8 depicts a circuit to generate impedance code of an up-driver. The circuit of FIG. 8 implements a method to generate an impedance relevant to an up-driver with an upper current source. The circuit comprises a comparator 111 having one input terminal for receiving a reference voltage source ½ VDDQ. The reference voltage source of (½) VDDQ is used even if VDD is used as a constant-voltage source. A current source I (which is generated using an embodiment illustrated in FIGS. 5–7) is connected to the constant-voltage source and to an impedance detector 113. The output between the current source I and the impedance detector 113 is input to a (−) input of the comparator 111. The output of the comparator 111 is fed back to a counter 112 and the impedance detector 113.

In operation, voltage is held when current of the current source I is transmitted to the impedance detector 113. The reference voltage at the (+) terminal of the comparator 111 is (½) VDDQ of the constant-voltage source is processed so as to generate an impedance of the reference voltage source (½) VDDQ corresponding to the current of the current source. The counter 112, which functions as a digital coding generator, generates the corresponding impedance code.

Figure 9:
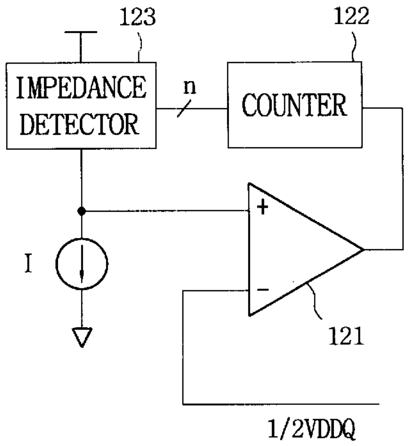
FIG. 9 is a high-level diagram of a circuit to generate a down-driver impedance code according to an embodiment of the present invention.

FIG. 9 is a high-level diagram of a circuit to generate a down-driver impedance code according to an embodiment of the present invention. The circuit of FIG. 9 implements a method to generate impedance of down-driver with a lower current source. The circuit comprises a comparator 121 which receives as input a reference voltage source (½) VDDQ. In this circuit, VDD must be used as a constant-voltage source. An impedance detector 123 is connected to the constant-voltage source and to the current source I. The current source I is connected to ground. The output between the impedance detector 123 and the current source I is connected to an input terminal of the comparator 121 and is used a reference voltage source. The output of the comparator 121 is fed back to a counter 122 and the impedance detector 123.

In operation, the comparator 121 processes the voltage output between the impedance detector 123 and the current source I which is held at the (+) terminal, and the reference voltage at the (−) terminal of the comparator 121, which is ½ VDDQ of the constant-voltage source, so as to generate an impedance of the reference voltage source (½) VDDQ corresponding to current of the current source I. The counter 112, which operates a digital code generator, generates an impedance code.

Figure 10:
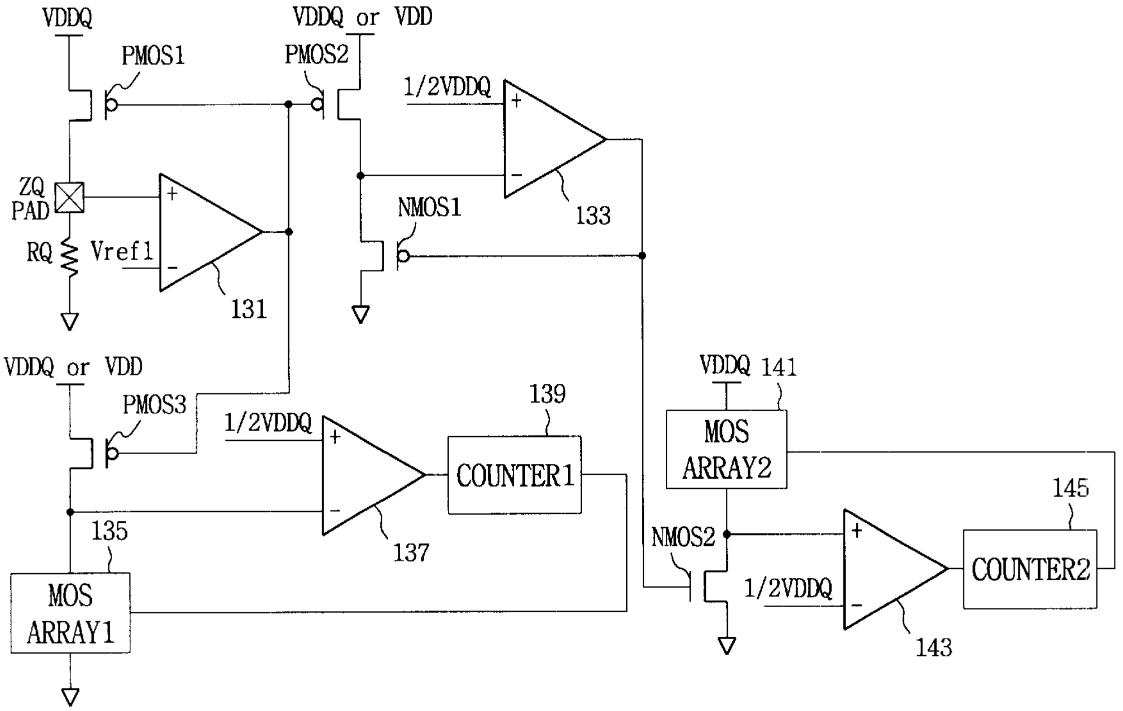
FIG. 10 is a diagram of an impedance control circuit according to an embodiment of the present invention.

FIG. 10 is an impedance control circuit diagram according to an embodiment of the present invention. A PMOS1 transistor is relevantly operated to generate current that flows through the external resistor RQ. Indeed, because the dynamic area of the gate voltage that enables the transistor to exist at the saturation area gets wider than when a NMOS is used, only one transistor is needed to generate a variety of current values that are relevant to various impedances. Furthermore, in spite of the characteristic insensitivity to VDD noise generated when NMOS is used, as much noise as allowed with the AC gain margin of an amplifier assembled at the gate of PMOS may be fed back and restored. As described above with FIGS. 4 through 9, it is necessary to generate a voltage value at the current source of a NMOS to enable the same current flowing from the PMOS to flow to the comparator with a (½) VDDQ power source. As a result, the circuit may have current to generate up and down impedance, that is, respectively generating up and down impedance to NMOS and PMOS current sources in the digital coding method.

Figure 11:
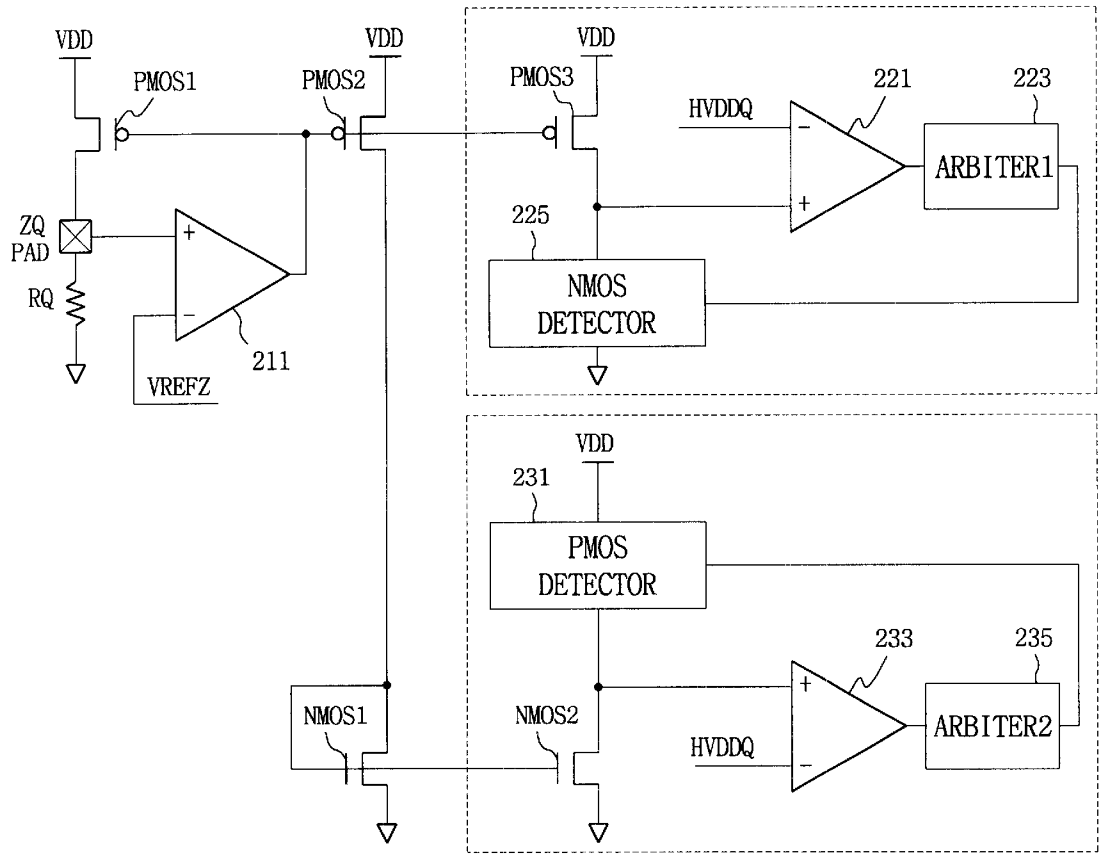
FIG. 11 is a diagram of an impedance control circuit diagram according to another embodiment of present invention.

FIG. 11 is an impedance control circuit diagram according to another embodiment of the present invention. The circuit comprises a current mirror which is used for generating current at the top and bottom portions the circuit. A PMOS current source, PMOS2, and a NMOS current source, NMOS1 are used for current mirrors. Since an additional amplifier is required in the circuit diagram of FIG. 10, the circuit may become more complicated and larger. Therefore, if adequate shielding is used to prevent noise from the current mirrors in the circuit shown in FIG. 11, it is possible to generate an accurate impedance value shown in FIG. 10.

In operation, the current of PMOS1 at the front portion of the circuit is transmitted to a diode part of the NMOS current mirror, another NMOS2 connected to the NMOS current mirror generates the same current as that of PMOS1, so as to generate two reference current sources for the up and down impedance.

Figure 12:
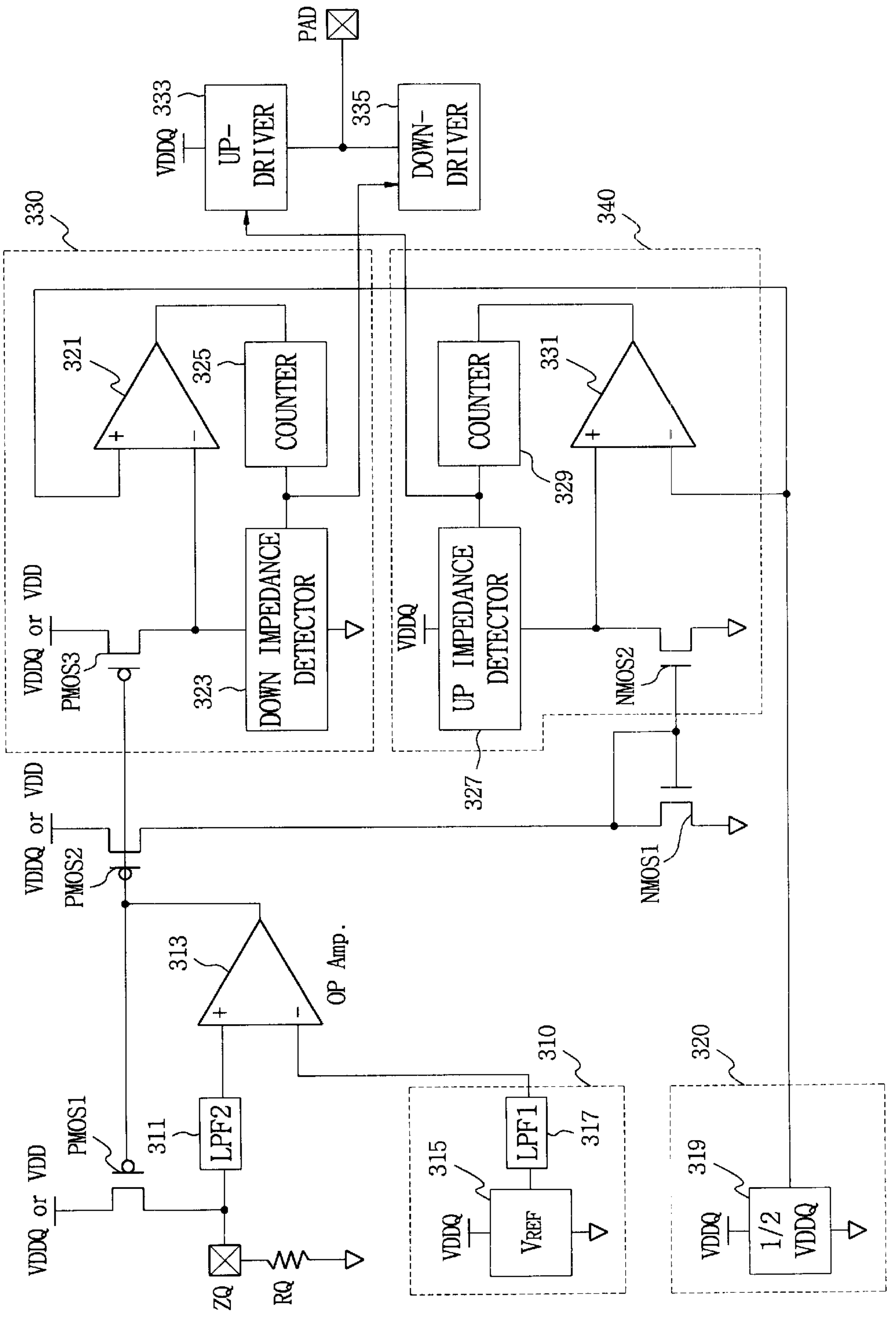
FIG. 12 is a diagram of an impedance control circuit according to yet another embodiment of the present invention.

FIG. 12 is a diagram illustrating an impedance control circuit according to another embodiment of the present invention. A constant-voltage source VDDQ or VDD is transmitted to PMOS1 which operates as a current source. The use of PMOS1 renders the circuit less sensitive to noise of PAD ZQ. The external resistor RQ is connected to ground. The voltage established by the combination of the PMOS1 and the external resistance RQ is output from ZQ. A first reference voltage generating circuit 310 generates a first reference voltage Vref 315 in relation to the voltage output from the PAD ZQ. In addition, a first comparator 313 compares the voltage output from the PAD ZQ and the first reference voltage 315 to generate current that is fed back to the PMOS1. In addition, current mirrors PMOS2 and NMOS1 are used to duplicate current from the first comparator 313 in order to reduce up/down mismatch. In addition, a pull-down circuit 330 (having an architecture as shown in FIG. 8) receives the voltage output from the current mirror of the PMOS2, and a pull-up circuit 340 (having an architecture as shown in FIG. 9) receives the voltage output from the current mirror of the NMOS1. The impedance code of the circuit 330 is output to a down-driver 335, and the impedance code of the circuit 340 is output to an up-driver 333.

Furthermore, a low pass filter LPF2 311 and LPF1 317 are respectively connected between the output of the PAD ZQ and the first comparator 313 and between the first reference voltage generating circuit 310 and the first comparator 313 to reduce noise.

As described above, an impedance control circuit of the present invention comprises: an external resistor connected between ground and PAD; a comparator to compare the voltage between the PAD and ground with the reference voltage and to generate impedance relevant to the reference voltage to the voltage between PAD and ground; and a PMOS current source connected with the constant-voltage source and PAD to generate current relevant to the impedance of the comparator. Furthermore, the current mirrors duplicate current of the PMOS current source and to transmit it to up and down drivers.

In the embodiment of FIG. 12, the pull-down circuit 330 comprises a first digital coding portion to receive the current generated from the PMOS current source (PMOS1), which is duplicated by the PMOS current mirror (PMOS2), and to digitally code the current relevant to the impedance. The pull-up circuit 340 comprises a second digital coding part to receive current generated from the PMOS current source (PMOS1), which is duplicated by the NMOS current mirror (NMOS1), and to digitally code the current relevant to the impedance.

More specifically, the pull-down circuit 330 comprises a second PMOS current source (PMOS3) with one end thereof being connected to constant-voltage source. The PMOS 3 receives current from the PMOS current mirror (PMOS2). The circuit 330 further comprise an NMOS detector 323 connected to ground and the second PMOS current source (PMOS3). A comparator 321 outputs an impedance corresponding to a comparison of a reference voltage (½ VDDQ) with a voltage established by the combination of the second PMOS current source (PMOS) and the NMOS detector 323. A digital coding circuit 325 (counter) generates an impedance code by digitally coding the impedance output from the comparator 321 and outputs the impedance code to a down-driver 335.

The pull-up circuit 340 comprises s second NMOS current source (NMSO2) with one end thereof being connected to ground. The NMOS2 receives current from the NMOS current mirror (NMOS1). The circuit 340 further comprises a PMOS detector 327 connected to the constant-voltage source and the second NMOS current source (NMOS2). A comparator 331 outputs an impedance corresponding to a comparison of the reference voltage (½ VDDQ) with a voltage established by the combination of the second NMOS current source (NMOS2) and the PMOS detector 327. A digital coding circuit 329 (counter) generates an impedance code by digitally coding the impedance output from the comparator 331 and outputs the impedance code to an up-driver 333.

Figure 13:
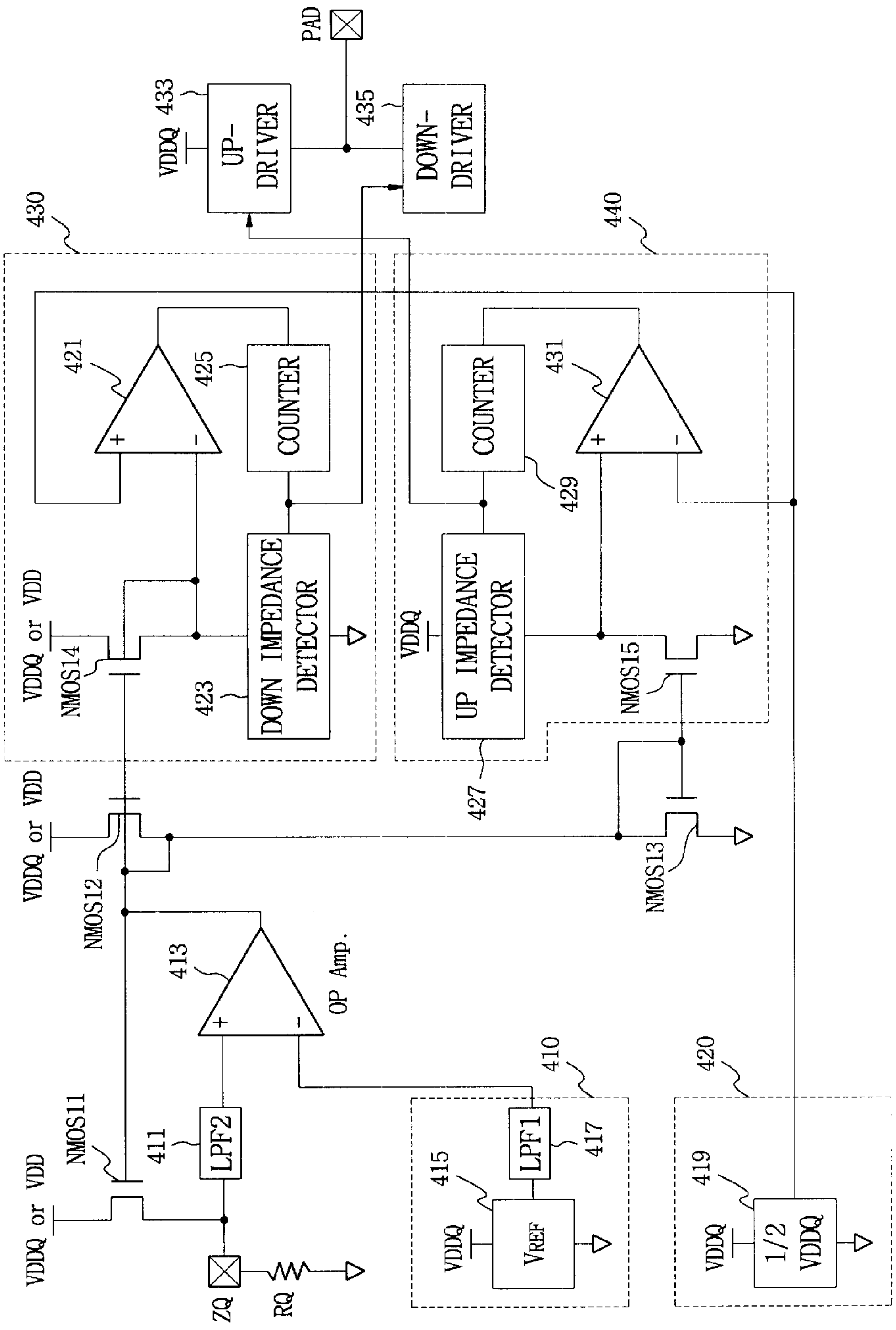
FIG. 13 is a diagram of an impedance control circuit according to another embodiment of the present invention.

FIG. 13 is a diagram of an impedance control circuit according to another embodiment of the present invention. As shown in FIG. 13, NMOS11 is used as a current source and is constructed to connect bulk and source. NMOS 11 is connected to constant-voltage VDDQ or VDD to PAD ZQ. An external resistor RQ is connected between PAD ZQ and ground. A voltage is generated on pad ZQ by the combination of the NMOS11 and external resistor RQ. A first reference voltage generating circuit 410 generates a first reference voltage Vref 415 which is compared with the voltage output from PAD ZQ by comparator 413. The comparator 413 generates a current with impedance corresponding to the result of the comparison of the first reference voltage 415 and the voltage output from the PAD ZQ. The output of the comparator 413 is fed back to the NMOS11.

To reduce up/down mismatch, current mirrors NMOS12 and NMOS 13 are provided to duplicate current output from the comparator 413. Furthermore, a pull-down circuit 430 (having an architecture as shown in FIG. 8) receives the voltage output from the current mirror of NMOS12, and pull-up circuit 440 (having an architecture as shown in FIG. 9) receives the voltage output from the current mirror of NMOS 13. The impedance codes of the circuits 430 and 440 are respectively output to down and up drivers 435, 433.

In addition, low pass filters LPF2 411 and LPF1 417 are respectively connected between the output of PAD ZQ and the comparator 413 and between the first reference voltage generating circuit 410 and the comparator 413.

As described above, in the impedance control circuit of the present invention, a PMOS is connected in a series with a resistor in consideration of gradually decreasing supply voltage, thereby preventing an additional transistor from being connected in a series. Without any back bias effect, a PMOS operates in a stable manner in a saturation area even at low supply voltages, which allows the internal power VDD or VDDQ to be used.

As described above, an impedance control circuit using PMOS or NMOS as power source provides advantages in that the circuit can reduce variance when an internal impedance is generated to an external resistor and effectively cope with a decrease in voltage of a chip caused by high-speed data transmission.

While the invention has been described in terms of preferred embodiments, those skilled in the art will recognize that modifications can be made within the spirit and scope of the present invention. Thus, the scope of the present invention should not be limited in the aforementioned embodiments, but extended the appended claims and equivalents to those claims.

What is claimed is:

1. An impedance control circuit, comprising:

an external resistor for establishing a first reference voltage;

a comparator for comparing the first reference voltage with a second reference voltage and outputting a control voltage corresponding to the result of the comparison;

a low pass filter, operatively connected to the comparator, for filtering the first reference voltage; and a PMOS current source, operatively connected to a constant-voltage source and to the output of the comparator, for generating a reference current that flows through the external resistor to generate the first reference voltage, wherein the control voltage output from the comparator is fed back to a gate terminal of the PMOS current source operating in a saturation region, to adjust the first reference voltage to be substantially equal to the second reference voltage.

2. The circuit of claim 1, further comprising a current mirror to duplicate the current generated by the PMOS current source and transmit the current to an up driver and a down driver.

3. The circuit of claim 2, wherein the current mirror comprises a PMOS transistor and an NMOS transistor.

4. The circuit of claim 3, further comprising:

a pull-down circuit for receiving the current generated by the PMOS transistor of the current mirror and digitally coding the current relevant to the impedance; and a pull-up circuit for receiving the current generated by the NMOS transistor of the current mirror and digitally coding the current relevant to the impedance.

5. The circuit of claim 4 wherein the pull-down circuit comprises:

a second PMOS current source, connected to a constant-voltage source, for receiving current from the PMOS transistor of the current mirror;

an NMOS detector connected to ground and to the second PMOS current source;

a second comparator for comparing a third reference voltage with a fourth reference voltage established by the combination of the second PMOS current source and the NMOS detector and outputting an impedance corresponding to the comparison; and a first encoder for digitally coding the impedance output from the second comparator and outputting an impedance code to the down-driver.

6. The circuit of claim 4, wherein the pull-up circuit comprises:

an NMOS current source, connected to ground, for receiving current from the NMOS transistor of the current mirror;

a PMOS detector connected to a constant-voltage source and to the NMOS current source;

a third comparator for comparing the third reference voltage with a fifth reference voltage established by the combination of the NMOS current source and the PMOS detector; and a second encoder for digitally coding the impedance output from the third comparator and outputting an impedance code to the up-driver.

7. An impedance control circuit, comprising:

an external resistor connected between ground and a pad;

a first comparator to compare a first reference voltage with a second reference voltage between the pad and ground and to output a control voltage corresponding to the result of the comparison;

a low pass filter connected between the pad and the first comparator;

a PMOS current source, operatively connected between a constant-voltage source and the pad, for generating a reference current that flows through the external resistor to generate the second reference voltage, wherein the control voltage output from the first comparator is fed back to a gate terminal of the PMOS current source operating in a saturation region, to adjust the second reference voltage to be substantially equal to the first reference voltage;

a current mirror for duplicating the current of the PMOS current source;

a pull-down circuit, operatively connected to the current mirror, wherein the pull-down circuit comprises: a second PMOS current source for receiving current from the current mirror; an NMOS detector operatively connected to the second PMOS current source; a second comparator for comparing a third reference voltage with a fourth reference voltage established by a combination of the second PMOS current source and the NMOS detector and outputting an impedance based on the result of the comparison; and a counter for generating an impedance code based on the output from the second comparator and outputting the impedance code to a down-driver; and a pull-up circuit, operatively connected to the current mirror, wherein the pull-up circuit comprises an NMOS current source for receiving current from the current mirror; a PMOS detector operatively connected to the NMOS current source; a third comparator for comparing the third reference voltage with a fifth reference voltage established by the combination of the NMOS current source and the PMOS detector and outputting an impedance based on the result of the comparison; and a second counter for generating an impedance code based on the output of the third comparator and outputting the impedance code to an up-driver.

8. The circuit of claim 7, further comprising a low pass filter, operatively connected to the first comparator, for filtering the first reference voltage.

9. The circuit of claim 7, wherein the current mirror comprises an NMOS transistor and a PMOS transistor.

10. The circuit of claim 9, wherein the PMOS transistor of the current mirror provides current to the second PMOS current source of the pull-down circuit and wherein the NMOS transistor of the current mirror provides current to the NMOS current source of the pull-up circuit.

11. An impedance control circuit, comprising:

an external resistor for establishing a first reference voltage;

a comparator for comparing the first reference voltage with a second reference voltage and outputting an impedance corresponding to the result of the comparison; and an NMOS current source connected to a constant-voltage source and to the output of the comparator, wherein the NMOS current source generates a current that corresponds to the impedance of the comparator, and wherein a source and bulk of the NMOS current source are connected.

12. The circuit of claim 11, further comprising a current mirror to duplicate the current generated by the NMOS current source and to transmit the current to an up driver and a down driver.

13. The circuit of claim 12, wherein the current mirror comprises a first NMOS transistor and a second NMOS transistor.

14. The circuit of claim 13, further comprising:

a pull-up circuit for receiving current generated by the current mirror and digitally coding the current relevant to the impedance; and a pull-down circuit for receiving current generated by the current mirror and digitally coding the current relevant to the impedance.

15. The circuit of claim 14, wherein the pull-down circuit comprises:

a second NMOS current source, connected to a constant-voltage source, for receiving current from the first NMOS transistor of the current mirror;

a first detector connected to ground and to the second NMOS current source;

a second comparator for comparing a third reference voltage with a fourth reference voltage established by the combination of the second NMOS current source and the first detector; and a first encoder for digitally coding the impedance output from the second comparator and outputting an impedance code to the down-driver.

16. The circuit of claim 14, wherein the pull-up circuit comprises:

a third NMOS current source, connected to ground, for receiving current from the second NMOS transistor of the current mirror;

a second detector connected to a constant-voltage source and connected to the third NMOS current source;

a third comparator for comparing the third reference voltage with a fifth reference voltage established by the combination of the third NMOS current source and the second detector; and a second encoder for digitally coding the impedance output from the third comparator and outputting an impedance code to the up-driver.

17. An impedance control circuit, comprising:

an external resistor for establishing a first reference voltage;

a comparator for comparing the first reference voltage with a second reference voltage and outputting an impedance corresponding to the result of the comparison;

an NMOS current source connected to a constant-voltage source and to the output of the comparator, wherein the NMOS current source generates a current that corresponds to the impedance of the comparator;

a current mirror to duplicate the current generated by the NMOS current source and to transmit the current to an up driver and a down driver, wherein the current mirror comprises a first NMOS transistor and a second NMOS transistor;

a pull-up circuit for receiving current generated by the current mirror and digitally coding the current relevant to the impedance; and a pull-down circuit for receiving current generated by the current mirror and digitally coding the current relevant to the impedance, wherein the pull-down circuit comprises: a second NMOS current source, connected to a constant-voltage source, for receiving current from the first NMOS transistor of the current mirror; a first detector connected to ground and to the second NMOS current source; a second comparator for comparing a third reference voltage with a fourth reference voltage established by the combination of the second NMOS current source and the first detector; and a first encoder for digitally coding the impedance output from the second comparator and outputting an impedance code to the down-driver.

18. The circuit of claim 17, wherein the pull-up circuit comprises:

a third NMOS current source, connected to ground, for receiving current from the second NMOS transistor of the current mirror;

a second detector connected to a constant-voltage source and connected to the third NMOS current source;

a third comparator for comparing the third reference voltage with a fifth reference voltage established by the combination of the third NMOS current source and the second detector; and a second encoder for digitally coding the impedance output from the third comparator and outputting an impedance code to the up-driver.

* * * * *